United States Patent [19]

Schwalm et al.

[11] Patent Number: 5,783,354
[45] Date of Patent: Jul. 21, 1998

[54] POSITIVE-WORKING RADIATION-SENSITIVE MIXTURE

[75] Inventors: Reinhold Schwalm, Wachenheim; Dirk Funhoff, Weinheim; Horst Binder, Lampertheim, all of Germany

[73] Assignee: BASF Aktiengesellschaft, Ludwigshafen, Germany

[21] Appl. No.: 711,016

[22] Filed: Sep. 9, 1996

[30] Foreign Application Priority Data

Sep. 11, 1995 [DE] Germany ............. 195 33 608.9

[51] Int. Cl.$^6$ ................. G03F 7/004; G03F 7/039
[52] U.S. Cl. ............ 430/170; 430/270.1; 430/905; 430/910; 522/31
[58] Field of Search ............ 430/170, 270.1, 430/191, 905, 910; 522/31

[56] References Cited

U.S. PATENT DOCUMENTS

| | | | |
|---|---|---|---|
| 3,844,787 | 10/1974 | Ulrich et al. | 430/270.1 |
| 3,915,706 | 10/1975 | Limburg et al. | 96/27 |
| 3,923,514 | 12/1975 | Marsha | 96/35 |
| 4,678,737 | 7/1987 | Sneller et al. | 430/270 |
| 5,116,715 | 5/1992 | Roland | 430/191 |
| 5,210,003 | 5/1993 | Schaedeli | 430/270 |
| 5,380,881 | 1/1995 | Schaedeli | 549/415 |
| 5,478,690 | 12/1995 | Kanda et al. | 430/193 |
| 5,670,294 | 9/1997 | Piro | 430/193 |

FOREIGN PATENT DOCUMENTS

| | | |
|---|---|---|
| 401 499 | 12/1990 | European Pat. Off. |
| 412 457 | 2/1991 | European Pat. Off. |
| 628 876 | 12/1994 | European Pat. Off. |
| 43 06 069 | 3/1993 | Germany . |
| 1103604 | 4/1989 | Japan . |

OTHER PUBLICATIONS

*Patent Abstracts of Japan*, vol. 16, No. 80 (p–1318), Feb. 26, 1992 (English abstract of JP–3267941, Nov. 28, 1991).

*Primary Examiner*—John S. Chu
*Attorney, Agent, or Firm*—Keil & Weinkauf

[57] ABSTRACT

A positive-working radiation-sensitive mixture essentially consists of ($a_1$) at least one water-insoluble, organic polymeric binder which contains acid-labile groups and becomes soluble in aqueous alkaline solutions as a result of the action of acid, or ($a_{2.1}$) a polymeric binder which is insoluble in water and soluble in aqueous alkaline solutions and ($a_{2.2}$) a low molecular weight organic compound whose solubility and aqueous alkaline developer is increased as a result of the action of acid, and (b) at least one organic compound which produces an acid under the action of actinic radiation, and, if required, (c) one or more further organic compounds which differ from (b), at least one of the components ($a_1$), ($a_{2.1}$), ($a_{2.2}$), (b) and (c) containing a bonded group of the general formula (I) —O$^\ominus$N$^\oplus$R$_4$, or component (c) being of the formula (II)

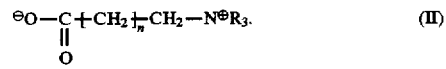

The radiation-sensitive mixture is suitable for the production of relief structures.

9 Claims, No Drawings

POSITIVE-WORKING RADIATION-SENSITIVE MIXTURE

The present invention relates to positive-working radiation-sensitive mixtures which contain acid-labile groups and photoactive components, are sensitive to actinic radiation and have improved contrast. These radiation-sensitive mixtures are particularly suitable as resist materials for single-layer resists for the production of relief patterns.

Positive-working radiation-sensitive mixtures which are based on the principle of chemical reinforcement are known per se. A species is produced in a primary photochemical reaction and, independently of the radiation, then triggers a catalytic secondary reaction and thus dramatically increases the sensitivity. Such systems which photochemically produce strong acid which then cleaves acid-labile groups in a secondary reaction are disclosed, for example, in U.S. Pat. Nos. 3,923,514 and 3,915,706 and DE-A 34 06 927.

The contrast of such resists, i.e. the sharpness in the differentiation between unexposed and exposed parts, is an important performance characteristic. Processes for improving the contrast are therefore constantly being sought.

It is an object of the present invention to provide a radiation-sensitive mixture which gives very good photosensitivity, good processing latitude, no loss of layer thickness between the various process steps and relief structures having an improved contrast.

We have found that this object is achieved, surprisingly, by the novel positive-working radiation-sensitive mixtures.

The present invention relates to positive-working radiation-sensitive mixtures essentially consisting of ($a_1$) at least one water-insoluble, organic polymeric binder which contains acid-labile groups and becomes soluble in aqueous alkaline solutions as a result of the action of acid, or ($a_{2.1}$) a polymeric binder which is insoluble in water and soluble in aqueous alkaline solutions and ($a_{2.2}$) a low molecular weight organic compound whose solubility in an aqueous alkaline developer is increased as a result of the action of acid, and (b) at least one organic compound which produces an acid under the action of actinic radiation, and, optionally, (c) one or more further organic compounds which differ from (b), wherein at least one of the components ($a_1$), ($a_{2.1}$), ($a_{2.2}$) (b) and (c) contains a bonded group of the general formula (I) —$O^{\ominus}N^{\oplus}R_4$, preferably a group of the formulae

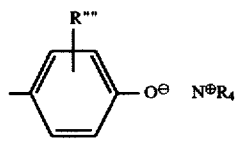

where R"" H, Halogen, Alkoxy or $C_1$–$C_4$-Alkyl

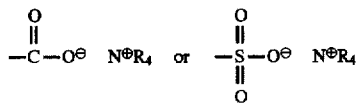

or component (c) is of the formula (III)

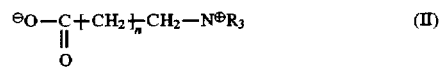

where R is an alkyl of 1 to 6 carbon atoms, preferably $CH_3$, and n is from 1 to 6.

Either the polymer ($a_1$) containing the acid-labile groups or the component ($a_{2.1}$) may contain units of the formulae (III), (IV) and/or (V)

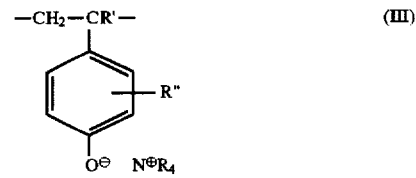

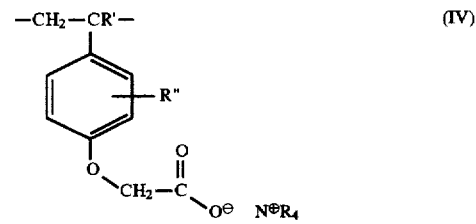

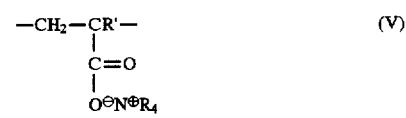

where R' is H or $CH_3$ and R" is H or alkyl of 1 to 4 carbon atoms, or the novel radiation-sensitive mixture may contain, as component (c), an organic compound selected from the group consisting of

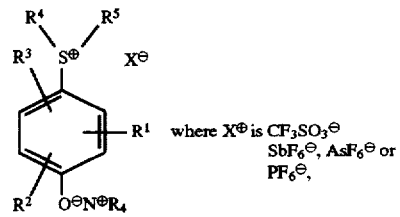

and $R^1$, $R^2$ and $R^3$ are identical or different and are each H, $CH_3$, $C_2H_5$, n—$C_3H_7$, $OCH_3$, phenyl, halogen or straight-chain or branched $C_4H_9$ and $R^4$ and $R^5$ may be identical or different and are each alkyl of 1 to 6 carbon atoms, phenyl or alkyl-, halogen- or hydroxyl-substituted phenyl, or $R^4$ is linked to $R^5$ via $CH_2$ groups to form a five- or six-membered ring,

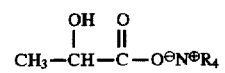

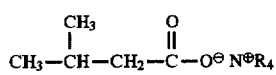

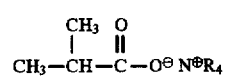

-continued

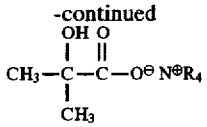
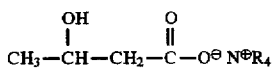
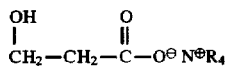
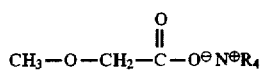
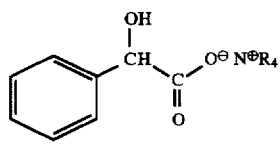
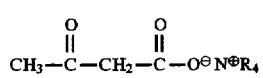

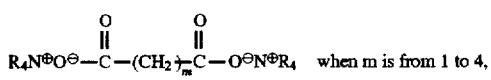 when m is from 1 to 4,

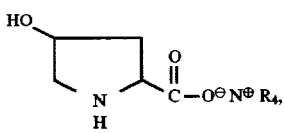
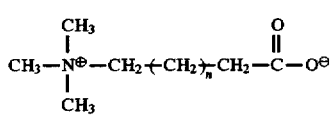

where n is from 1 to 3,

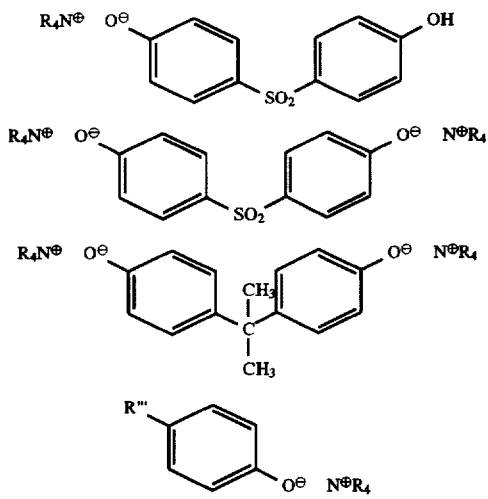

where R''' is H, alkyl or Cl.

Sulfonium salts or iodonium salts are preferably used as component (b); however, compounds such as benzoin tosylate, pyrogallol trimesylate, o-nitrobenzyl tosylate, diaryl disulfone, bisarylsulfonyldiazomethane, biscyclohexylsulfonyldiazomethane, iminosulfonates having the structural unit

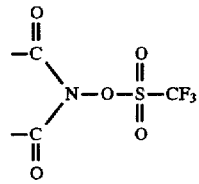

or mixtures of the abovementioned compounds may also be used as component (b).

Other preferred radiation-sensitive mixtures are those whose polymers (a.) contain units of the formulae (VI), (VII) and, optionally, (VIII)

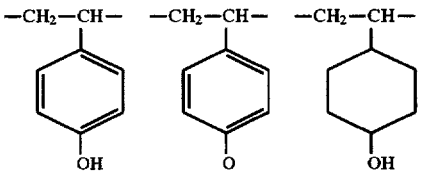

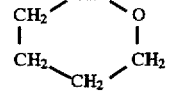

(VI)   (VII)   (VIII)

preferably 35–70 mol % of units of the formula (VI) 30–50 mol % of units of the formula (VII) and 0–15 mol % of units of the formula (VIII) being present as structural units of the polymers.

The novel radiation-sensitive mixture is preferably present in the form of a solution in an organic solvent or solvent mixture and is processed from this.

The present invention also relates to a process for the preparation of photosensitive coating materials and a process for the production of relief structures by application of a novel radiation-sensitive mixture in a layer thickness of from 0.1 to 5 μm to a substrate pretreated in a conventional manner, drying at from 70° to 140° C., imagewise exposure, if required postbaking at 40°–160° C., and development with an aqueous alkaline solution, wherein the novel radiation-sensitive mixture is used.

The novel radiation-sensitive mixtures have high sensitivity to actinic light and can be processed to give relief structures having substantially improved contrast. Moreover, they are distinguished by easier processibility, good resolution and better processing stability.

Regarding the components of the novel radiation-sensitive mixture, the following may be stated specifically.

Examples of suitable water-insoluble polymeric organic binders ($a_1$) which contain acid-labile groups and whose solubility in aqueous alkaline developers increases as a result of the action of acid are polymers based on poly(p-hydroxystyrene) or poly(p-hydroxy-a-methylstyrene), some of whose hydroxyl groups are replaced by tert-butoxy, tert-butoxycarbonyloxy, tert-amylcarbonyloxy or p-tetrahydropyranyloxy groups, and all conventional water-insoluble organic binders which contain acid-labile groups and whose solubility in aquoeus alkaline developers increases as a result of the action of acid.

Examples of acid-labile groups which may be used are in particular ether, ester, acetal, ketal and carbonate groups. Ethers, such as tert-butyl ether, trimethylsilyl ether or tert-butyl dimethylsilyl ether, acetals, such as tetrahydropyranyl ether, and ketals, such as 4-methoxytetrahydroypyranyl ether and 1-methyl-1-methoxyethyl ether, are preferred.

Particularly suitable water-insoluble polymers ($a_1$) which contain acid-labile groups and whose solubility in aqueous alkaline developers increases as a result of the action of acid are polymers or copolymers which contain 4-hydroxystyrene, 2,6-dimethyl-4-hydroxystyrene, 2-methyl-4-hydroxystyrene, 4-hydroxy-alpha-methylstyrene, tert-butoxystyrene, tert-butoxycarbonyloxystyrene, tetrahydropyranyloxystyrene, tert-butyldimethylsilyloxystyrene, trimethylsilyloxystyrene or 4-methoxytetrahydropyranyloxystyrene as monomer units. In addition, all monomers copolymerizable with styrene, for example acrylates, methacrylates, sulfur dioxide and maleimides, are suitable comonomers.

The molecular weights ($\overline{M}_w$) of these homo- or copolymers ($a_1$) are from 2000 to 100,000, preferably from 4000 to 35,000. All polymers of this type which are described in DE-A-4 007 924 and DE-A-4 202 845 are also preferred.

Other particularly preferred polymers ($a_1$) are those which contain units of the formulae (VI), (VII) and (VIII)

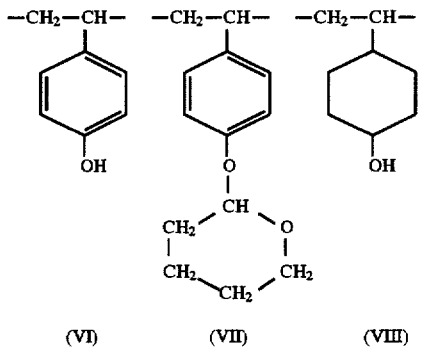

Such polymers ($a_1$) to be used according to the invention generally have molecular weights ($\overline{M}_w$) of from 2000 to 100,000, preferably from 4000 to 30,000 and can be prepared, for example, from poly(p-hydroxystyrene) or preferably poly(p-hydroxystyrene) additionally containing non-aromatic cyclic alcohol units (vinylcyclohexan-4-ol units) in amounts of up to 15 mol %, for example by polymer-analogous reaction with corresponding amounts of dihydropyran in the presence of acid. An appropriate process is described in EP-342 498-B (DE-A-3 817 012).

Examples of other suitable starting materials for the preparation of such polymers ($a_1$) to be used according to the invention are partially hydrogenated poly(p-hydroxystyrene) as described in J 01 103 604-A and EP-A-0 401 499.

Such polymers ($a_1$) may contain the units of the formulae (VI), (VII) and (VIII), for example, in amounts of 35–70 mol % of units of the formula (VI), 30–50 mol % of units of the formula (VII) and 0–15 mol % of units of the formula (VIII).

If the polymers ($a_1$) contain no units of the formula (VIII), preferably 50–70 mol % of units of the formula (VI) and 30–70 mol % of units of the formula (VII) are incorporated as structural units.

However, the polymer ($a_1$) preferably contains units of the formula (VIII) in amounts of from 2 to 15 mol %, preferably 6 to 14 mol %, based on the total amount of structural units of the formulae (VI), (VII) and (VIII) incorporated as structural units. In this case, the polymer ($a_1$) usually contains of from 37 to 60 mol %, and in particular of from 38–56 mol % of the structural unit of the formula (VI) and from 38 to 48 mol % of the structural unit of the formula (VII).

Suitable polymeric binders ($a_{2.1}$) which are insoluble in water but soluble in aqueous alkaline solutions are those based on homo- or copolymers of 4-hydroxystyrene and/or 4-hydroxy-alpha-methylstyrene, particularly comonomer units being hydroxystyrenes which are mono- or disubstituted ortho to the hydroxyl group or hydroxystyrenes whose phenolic group is protected by acid-labile groups. Particularly preferred acid-labile groups are ethers, such as tert-butyl ether, trimethylsilyl ether or tert-butyldimethylsilyl ether, acetals, such as tetrahydropyranyl ether, esters, such as tert-butyl esters, and ketals, such as 4-methoxytetrahydroypyranyl ether and 1-methyl-1-methoxyethyl ether. Comonomer units containing these acid-labile groups are present only in amounts such that the polymeric binder ($a_{2.1}$) is soluble in an aqueous alkaline medium. In general, ranges from 5 to 50 mol % are preferred for this purpose.

The polymers ($a_{2.1}$) have a molecular weight ($\overline{M}_w$) of from 2000 to 100,000, preferably from 4000 to 30,000.

Examples of low molecular weight organic compounds ($a_{2.2}$) whose solubility in an aqueous alkaline developer is increased as a result of the action of acid, i.e. those which contain acid-labile groups, are:

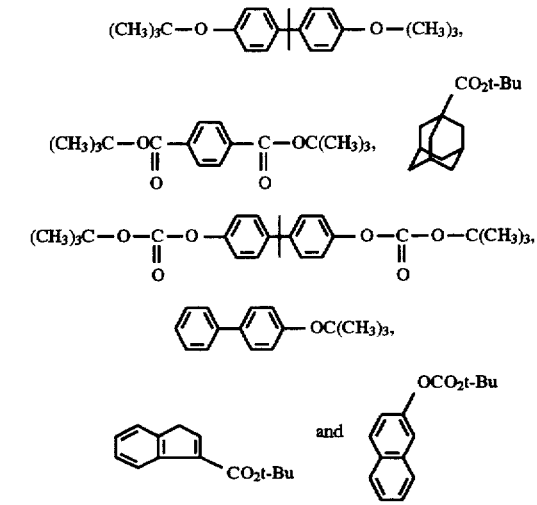

Nonpolymeric compounds which have at least one aromatic ring system with one or more tetrahydropyranyloxy substituents according to EP-A-0 475 903 may also be used, for example:

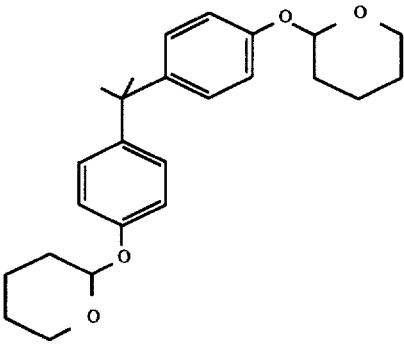

-continued

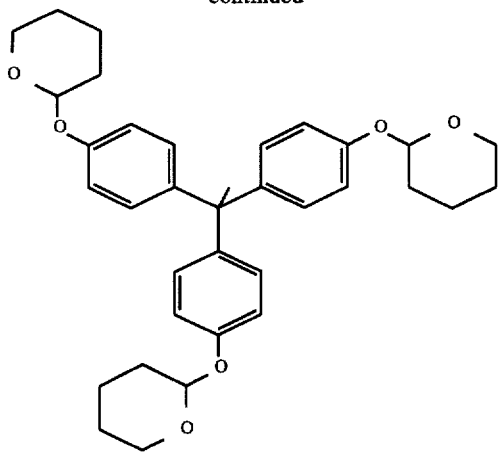

The polymer (a.) or the combination $(a_{2.1})+(a_{2.2})$ is present in the novel mixture in general in an amount of from 80 to 99.5, preferably from 90 to 99% by weight, based on the total amount of the components $(a_1)+(b)$ or $(a_{2.1})+(a2.2)+(b)$.

Suitable organic compounds which produce an acid under the action of actinic radiation (b) are all photochemical acid donors known to persons skilled in the art.

Sulfonium or iodonium salts of the general formula (IX) or (X)

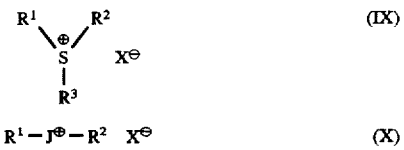

where $R^1$, $R^2$ and $R^3$ are identical or different and are each straight-chain or branched alkyl of 1 to 18, preferably 1 to 6, carbon atoms, e.g. methyl, ethyl, n-propyl, isopropyl, n-butyl, isobutyl, tert-butyl, hexyl, oxaalkyl having up to 3 oxygen atoms and up to 10 carbon atoms, aryl of 6 to 12 carbon atoms, e.g. phenyl or naphthyl, $C_1$–$C_6$-alkyl- or $C_1$–$C_6$-alkoxy-substituted aryl, aralkyl, e.g. benzyl, or the radical

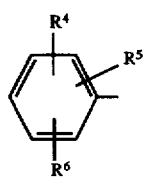

where $R^4$, $R^5$ and $R^6$ are identical or different and are each H, OH, halogen, alkyl of 1 to 18, preferably 1 to 6, carbon atoms, e.g. methyl, ethyl, n-propyl, n-butyl, isobutyl, tert-butyl or hexyl, or alkoxy of 1 to 6 carbon atoms, e.g. methoxy, ethoxy, propoxy or butoxy, and $X^\ominus$ is a nonnucleophilic opposite ion, are preferred.

Examples of suitable components (b) according to the general formulae (IX) and (X) are triphenylsulfonium salts and diphenyliodonium salts and tris(4-hydroxyphenyl)sulfonium salts and bis(4-hydroxyphenyl)iodonium salts.

Particularly suitable sulfonium salts are of the general formula (XI)

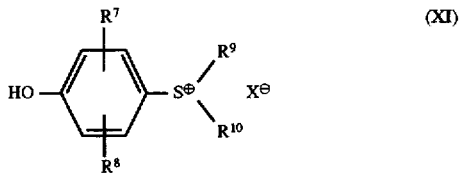

where $R^7$ and $R^8$ are identical or different and are each H, OH, alkyl of 1 to 18, preferably 1 to 6, carbon atoms, e.g. methyl, ethyl, n-propyl, n-butyl, isobutyl, tert-butyl or hexyl, or alkoxy of 1 to 6 carbon atoms, e.g. methoxy, ethoxy, propoxy or butoxy, or phenyl. $R^9$ and $R^{10}$ are identical or different and are each alkyl of 1 to 18, preferably 1 to 6, carbon atoms, e.g. methyl or butyl, phenyl or alkyl-, halogen- or hydroxyl-substituted phenyl, or $R^9$ is linked to $R^{10}$ via $CH_2$ groups to give a five- or six-membered ring, and $X^\ominus$ is a nonnucleophilic opposite ion.

Examples of particularly advantageous sulfonium salts are 4-hydroxyphenyldimethylsulfonium and 3,5-dimethyl-4-hydroxyphenyldimethylsulfonium salts and 3-ethyl-5-methyl-4-hydroxyphenyldimethylsulfonium salts.

Examples of suitable, nonnucleophilic anions $X^\ominus$ are complex metal halides, such as tetrafluoroborate, hexafluoroantimonate, hexafluoroarsenate and hexafluorophosphate, and strong organic anions, such as trifluoromethanesulfonate (=triflate) and fluorosulfonate.

The sulfonium salts of the general formula (XII)

where $R^{11}$, $R^{12}$ and $R^{13}$ are identical or different and are each aliphatic and/or aromatic radicals which may contain heteroatoms, or two of the radicals $R^{11}$ to $R^{13}$ are linked to one another to form a ring, with the proviso that at least one of the radicals $R^{11}$ to $R^{13}$ contains at least one group cleavable by acid, preferably tert-butyl carbonates of phenols or silyl ethers of phenols, and one of the radicals $R^{11}$ to $R^{13}$ may be linked to one or more further sulfonium salt radicals, if desired via acid-cleavable groups, and $X^\ominus$ is a nonnucleophilic opposite ion, are also noteworthy.

Two or more sulfonium units in the molecule may furthermore be linked via the radicals $R^{11}$ to $R^{12}$.

Preferred sulfonium salts of the general formula (XII) are those in which $R^{11}$ and $R^{12}$ are each methyl and $R^{13}$ is a substituted phenyl derivative having acid-cleavable groups, for example

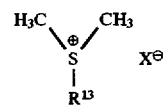

where $R^{13}$ is, for example, 4-tert-butylcarbonyloxyphenyl, 4-tert-butoxycarbonyloxy-3,5-dimethylphenyl, 4-tert-butoxycarbonyloxy-3-methylphenyl, 4-tert-butoxycarbonyloxy-2-methylphenyl, 4-tert-butoxycarbonyloxy-3,5-dimethoxyphenyl, 4-tert-butoxycarbonyloxy-3,5-dimethylphenyl, 1-tert-butoxycarbonyloxynaphthyl, 4-trimethylsilyloxyphenyl or 4-trimethylsilyloxynapththyl, or those in which two of the radicals $R^{11}$ to $R^{13}$ are linked to one another to give a ring, in particular a five- or six-membered ring, for example $R^{11}$ and $R^{12}$ being bridged to give, for example, tetramethylene groups, and $R^{13}$ has the same meanings as above:

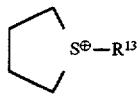

or compounds in which $R^{11}$ is methyl and $R^{12}$ is phenyl or tolyl and $R^{13}$ is a substituted phenyl derivative having acid-cleavable groups, where $R^{13}$ is 4-tert-butoxycarbonyloxyphenyl, 2,4-di-tert-butoxycarbonyloxyphenyl, 4-tert-butoxycarbonyloxy-2-methoxyphenyl or 4-trimethylsilylphenyl, or where $R^{11}$ is phenyl or $C_1$-$C_{12}$-alkyl-substituted phenyl or halogen-substituted phenyl and $R^{12}$ and $R^{13}$ are substituted phenyl derivatives having acid-cleavable groups, where $R^{12}$ and $R^{13}$ are each, for example, 4-tert-butoxycarbonyloxyphenyl, 4-trimethylsilyloxyphenyl, 4-tert-butyldimethylsilyloxyphenyl or 4-tert-butoxycarbonyloxy-3,5-dimethylphenyl, or $R^{11}$, $R^{12}$ and $R^{13}$ are identical to one another, i.e. sulfonium salts which contain three of these radicals having acid-cleavable groups.

Preferred examples of compounds (b) are dimethyl-4-tert-butoxycarbonyloxyphenylsulfonium salts with hexafluoroarsenate, hexafluoroantimonate, hexafluorophosphate, hexafluoroborate or trifluoromethanesulfonate as the opposite ion, phenyl(bis(4-tert-butoxycarbonyloxyphenyl)sulfonium salt with the stated opposite ions, tris(4-tert-butoxycarbonyloxyphenyl) sulfonium salt with the stated opposite ions or 1-naphthyl-4-trimethylsilyloxytetramethylenesulfonium salts with the stated opposite ions.

In addition to these sulfonium and iodonium salts, suitable organic compounds (b) which produce an acid under the action of actinic radiation are, for example, benzoin tosylate, pyrogalloe trimesylate, o-nitrobenzyl tosylate, diaryl disulfones, such as diphenyl disulfone or substituted diphenyl disulfones of the formula

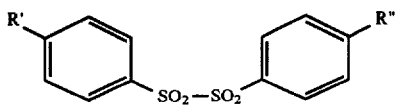

where R' and R" are identical and different and are each H, $CH_3$, $C_2H_5$, $C_3H_7$, $C_4H_9$, $OCH_3$, $OC_2H_5$ or Cl, e.g. di-(p-tolyl) disulfone, bis(arylsulfonyl)diazomethanes, for example those of the formula

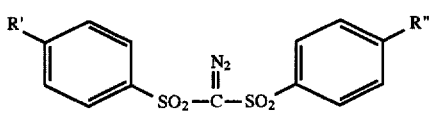

where R' and R" are identical or different and are each H, $CH_3$, $C_2H_5$, $C_3H_7$, $C_4H_9$,

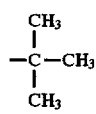

or Cl, bis(cyclohexylsulfonyl)diazomethane, iminosulfonates having the structural unit

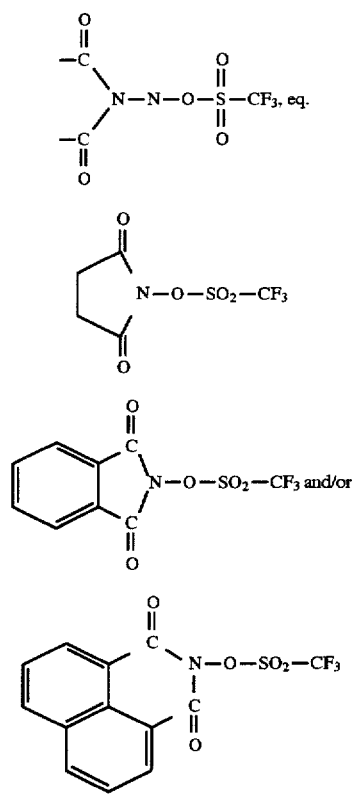

Other preferred components (b) are alkylsulfonic esters of compounds which contain at least two phenolic hydroxyl groups. Examples of particularly suitable substances are 1,2,3-tris(methanesulfonyloxy)benzene and 1,3-bis (methanesulfonyloxy)benzene and disulfones, e.g. diphenyl disulfone, 4-(methoxyphenyl)phenyl disulfone and bis(4-hydroxyphenyl) disulfone.

Mixtures of the compounds stated under (b) with one another or with other organic photochemical acid donors not explicitly stated here may also be used. The total amount of all components (b) in the novel radiation-sensitive mixture is in general from 0.5 to 20, preferably from 1 to 10, % by weight, based on the sum of all components $(a_1)+(b)$ or $(a_{2.1})+(a_{2.2})+(b)$ in the radiation-sensitive mixture.

Suitable components (c) which may be used according to the invention are organic compounds which contain groups of the general formula (I)

which are not bonded to polymeric radicals and where R is alkyl of 1 to 6 carbon atoms, such as $C_4H_9$, $C_3H_7$, $C_2H_5$ or, preferably, $CH_3$. Examples of such organic compounds (c) are

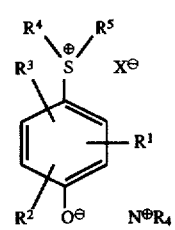

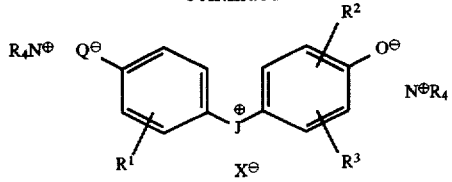

where $R^1$, $R^2$ and $R^3$ are identical or different and are each H, $CH_3$, $C_2H_5$, n-$C_3H_7$, $OCH_3$, halogen (e.g. Cl, Br or I), phenyl, or straight-chain or branched $C_4H_9$ and $R^4$ and $R^5$ may be identical or different and are each alkyl of 1 to 6, preferably 1 to 4, carbon atoms, for example methyl, ethyl, n-propyl, isopropyl, n-butyl or isobutyl, preferably methyl, phenyl or phenyl which is substituted by alkyl, such as methyl, ethyl or isopropyl, by halogen, such as chlorine, or by hydroxyl, or $R^4$ is linked to $R^5$ via $CH_2$ groups to give a five- or six-membered ring and $X^\ominus$ is $BF_4^\ominus$, $AsF_6^\ominus$, $SbF_6^\ominus$, $PF_6^\ominus$ or $CF_3SO_3^\ominus$ and R has the abovementioned meaning, and compounds of the following formulae

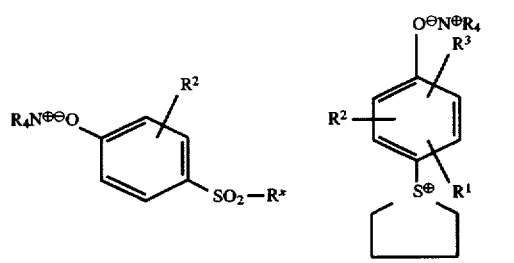

where $R^x$ is $CH_3$, $C_2H_5$, $CH_2$—CN, $OCH_3$ or $CH_2$—$NO_2$,

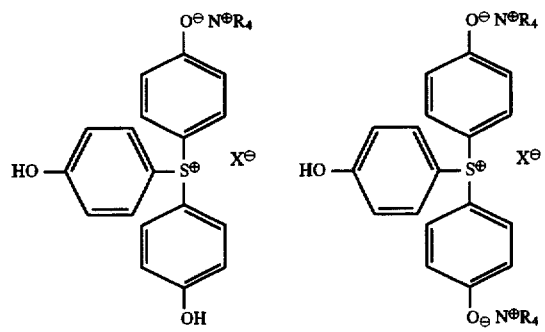

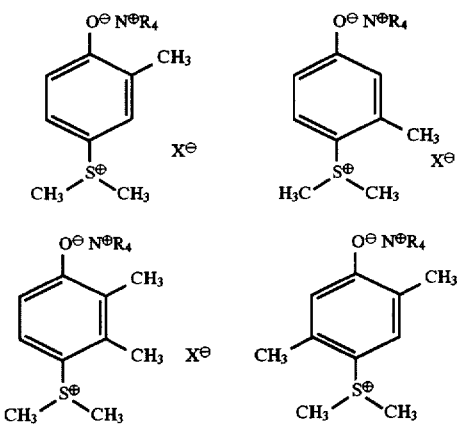

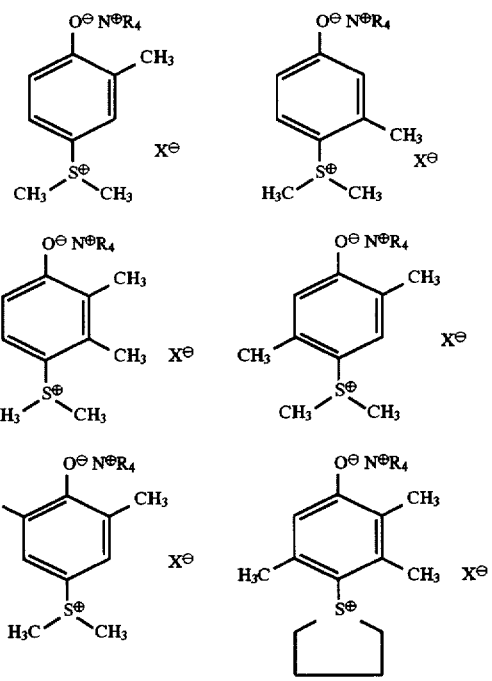

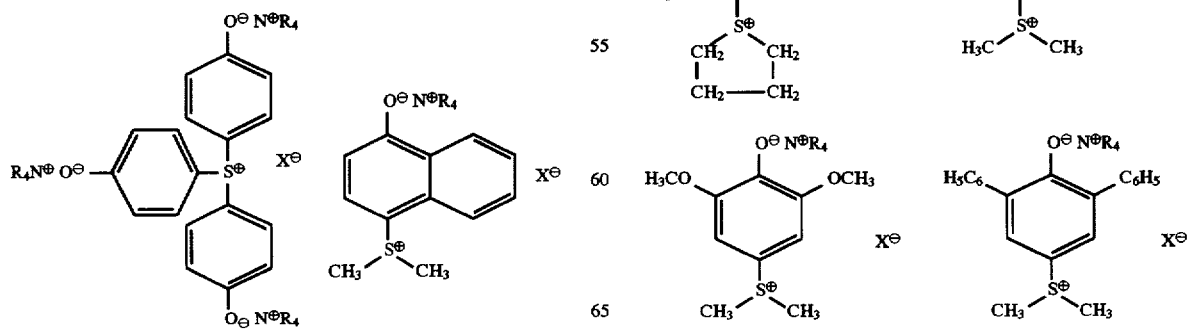

-continued

[Structure: 4-hydroxyphenyl-(methyl)(4-halogen or NO2-benzyl)sulfonium with O⁻ N⁺R₄ at para position, X⁻ counterion]

Other components (c) which may be used according to the invention are the following organic compounds which contain groups of the formula (I) or (II)

—O⁻N⁺R₄      ⁻O—C(=O)—(CH₂)ₙ—CH₂—N⁺R₃

(I)      (II)

where n is from 1 to 6, preferably groups of the formula $$-\text{C}(=\text{O})-\text{O}^{\ominus} \text{N}^{\oplus}\text{R}_4$$

for example:

CH₃—CH(OH)—C(=O)—O⁻ N⁺R₄

CH₃—CH(CH₃)—CH₂—C(=O)—O⁻ N⁺R₄

CH₃—CH(CH₃)—C(=O)—O⁻ N⁺R₄

CH₃—C(OH)(CH₃)—C(=O)—O⁻ N⁺R₄

CH₃—C(OH)—CH₂—C(=O)—O⁻ N⁺R₄

CH₂(OH)—CH₂—C(=O)—O⁻ N⁺R₄

CH₃—O—CH₂—C(=O)—O⁻ N⁺R₄

[phenyl-C(OH)—C(=O)—O⁻ N⁺R₄]

[phenyl-C(=O)—O⁻ N⁺R₄]

CH₃—[C₆H₄]—C(=O)—O⁻ N⁺R₄

-continued

H₃C—C(=O)—O⁻ N⁺R₄

CH₃—C(=O)—CH₂—C(=O)—O⁻ N⁺R₄

N⁺R₄ ⁻O—C(=O)—(CH₂)ₙ—C(=O)—O⁻ N⁺R₄

[4-hydroxy-pyrrolidine-2-C(=O)—O⁻ N⁺R₄]

H₃C—N⁺(CH₃)(CH₃)—CH₂—(CH₂)ₙ—CH₂—C(=O)—O⁻ N⁺R₄ where n is 1, 2 or 3.

The tetraalkylammonium group N⁺R₄ may thus either be bonded to the polymer (a) or be part of monomeric, low molecular weight organic compounds.

The tetraalkylammonium group is present in the novel radiation-sensitive mixture in general in amounts of from 0.01 to 50, preferably from 0.1 to 10 mol percent, based on the component (b).

The novel radiation-sensitive mixture may additionally contain further, conventional assistants and additives corresponding to the prior art (sensitizers, colorants, leveling agents, wetting agents, stabilizers, etc.). These additives are introduced in general in amounts of less than 3% by weight.

For the production of resists, the novel mixtures are preferably dissolved in an organic solvent, the solids content usually being from 5 to 40% by weight. Preferred solvents are aliphatic ketones, ethers and esters and mixtures thereof. Alkylene glycol monoalkyl ethers, such as ethylcellosolve, butylglycol, methylcellosolve and 1-methoxy-2-propanol, alkylene glycol alkyl ether esters, such as methylcellosolve acetate, methylpropylene glycol acetate and ethylpropylene glycol acetate, ketones, such as cyclohexanone, cyclopentanone and methyl ethyl ketone, and acetates, such as butyl acetate and ethyl acetate, other esters, such as ethyl lactate and butyrolactone, and aromatics, such as toluene and xylene, are particularly preferred. The choice of the appropriate solvents and of mixtures thereof depends on the choice of the respective components of the radiation-sensitive mixture.

Other additives, such as adhesion promoters and plasticizers, may also be added, in general in amounts of up to 1% by weight.

The novel radiation-sensitive mixtures are sensitive to X-rays, electron radiation and UV radiation. If necessary, small amounts of sensitizers may be added, for example pyrene and perylene, in order to sensitize the compounds in the longer-wave UV to the visible wavelength range. High transparency of the layers at the respective exposure wavelength is required for exposure in specific wavelength ranges, for example to short-wave UV (<300 nm). In conventional exposure units based on mercury lamps, the 254 nm line is used or Excimer lasers which emit at 248 nm (KrF) are employed. Radiation-sensitive recording materials should therefore have very low optical densities in this range.

In the novel process for the production of positive relief patterns, a radiation-sensitive recording layer which essentially consists of the novel radiation-sensitive mixture is exposed imagewise to a dose of actinic radiation such that the solubility of the exposed parts in aqueous alkaline solvents, after a possible postbake at from 40° to 160° C., increases and these parts can be selectively removed with the alkaline developer.

The photoresist solutions containing the novel radiation-sensitive mixture are generally applied in layer thicknesses of from 0.1 to 5 μm, preferably from 0.5 to 1.5 μm, to suitable substrates, for example surface-oxidized silicon wafers, by spin coating and are dried (for example at from 70° to 140° C.) and exposed imagewise through a photomask to a suitable light source, for example to short-wave UV radiation (deep UV) having wavelengths of from 200 to 300 nm. Particularly suitable light sources are KrF Excimer lasers (248 nm). After the imagewise exposure, and optionally after a brief postbake at up to 160° C., development is effected with customary aqueous alkaline developers, in general at pH of from 12 to 14, the exposed parts being washed out. The resolution is in the submicron range. The exposure energy required for the novel radiation-sensitive mixture is in general from 10 to 300 mJ/cm$^2$ in the case of layer thicknesses of 1 μm.

The novel radiation-sensitive mixtures possess high sensitivity, good resolution and good processibility, in particular improved exposure latitude and long shelf life after exposure and are therefore particularly advantageous for lithography in the short-wave range, since both contrast and depth of focus are improved.

The contrast of the resist, expressed by means of the gamma value ($\Gamma_p$), was determined from the plot of layer thickness against exposure dose. For positive resist systems, the gamma value is defined as $$\Gamma_p = \left[ \log \frac{D_1}{D_0} \right]^{-1}$$

where $D_0$ and $D_1$ are the extrapolated exposure energy doses from the dark decay energy curve.

In the examples and comparative examples which follow, parts and percentages are by weight, unless stated otherwise.

Comparative Example 1

A photoresist solution was prepared from 5 parts of 4-hydroxyphenyldimethylsulfonium triflate, 95 parts of poly[4-hydroxystyrene-co-4-tetrahydroxypyranyloxystyrene] (molar ratio of the comonomers 60:40) and 300 parts of ethyl lactate.

This solution was filtered through a filter having a pore diameter of 0.2 μm.

A layer, about 0.8 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 6 was found.

Example 1

A photoresist solution was prepared similarly to Comparative Example 1, except that 3 mol %, based on 4-hydroxyphenyldimethylsulfonium triflate, of trimethylammonium butyrobetaine were added. After the further processing described in Comparative Example 1, a gamma value of 7 was found.

Example 2

A photoresist solution which was prepared similarly to Comparative Example 1, but with the addition of 5 mol %, based on 4-hydroxyphenyldimethylsulfonium triflate, of trimethylammonium butyrobetaine gave a gamma value of 9.

Example 3

To test the photolithographic properties, the resist solutions of Comparative Example 1 and Examples 1 and 2 were applied to wafers of 200 mm diameter in a layer thickness of about 800 nm. After heating at 130° C. on a hotplate, the wafers were exposed to a wafer stepper from ASM Lithography, type PAS 5500. After different waiting times, the wafers were then postbaked at 130° C. and were washed out in an aqueous alkaline developer.

The line widths were then determined as a function of the waiting time, by scanning electron microscopy.

The table below shows the resulting line widths of 250 nm structures.

|  |  | Waiting time | | |
| --- | --- | --- | --- | --- |
|  |  | 10 min | 30 min | 60 min |
| Comparative Example 1 | without addition | 254 nm | 230 nm | 220 nm |
| Example 1 | with 2 mol % of triethylammonium butyrobetaine | 255 nm | 250 nm | 245 nm |
| Example 2 | with 5 mol % of trimethylammonium butyrobetaine | 253 nm | 250 nm | 246 nm |

Comparative Example 2

A photoresist solution was prepared from 5 parts of 2,3,5-trimethyl-4-hydroxyphenyldimethylsulfonium triflate, 95 parts of poly[4-hydroxystyrene-co-4-tetrahydropyranyloxystyrene] (molar ratio of the comonomers 55:45) and 300 parts of ethyl lactate and was then filtered through a filter having a pore diameter of 0.2 μm.

A layer, about 0.8 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 7 was found.

Example 4

A photoresist solution was prepared similarly to Comparative Example 2, except that 3 mol %, based on 2,3,5-trimethyl-4-hydroxyphenyldimethylsulfonium triflate, of the compound $$CH_3-\underset{\underset{CH_3}{|}}{\overset{\overset{OH}{|}}{C}}-\overset{O}{\overset{\|}{C}}-O^{\ominus} \ N^{\oplus}(CH_3)_4,$$

(=C1) were added.

After processing according to Comparative Example 2 a gamma value of 10 was found.

Example 5

A photoresist solution was prepared similarly to Example 2, but with 6 mol %, based on 2,3,5-trimethyl-4-hydroxyphenyldimethylsulfonium triflate, of the compound C1. A gamma value of 9.5 was found.

Example 6

To test the shelf life, the resist solutions of Comparative Example 2 and Examples 4 and 5 were applied to 200 mm wafers in a layer thickness of about 800 nm.

The further processing and testing were carried out as described under Example 3.

|  |  | Waiting time | | |
|---|---|---|---|---|
|  |  | 10 min | 30 min | 60 min |
| Comparative Example 2 | without addition of C1 | 252 nm | 235 nm | 225 nm |
| Example 4 | with 3 mol % of C1 | 252 nm | 250 nm | 243 nm |
| Example 5 | with 6 mol % of C1 | 251 nm | 250 nm | 248 nm |

Comparative Example 3

A photoresist solution was prepared from 5 parts of 2-methyl-4-hydroxy-5-isopropylphenyldimethylsulfonium triflate, 95 parts of poly[4-hydroxystyrene-co-4-tetrahydropyranyloxystyrene] (molar ratio of the comonomers 65:35) and 320 parts of ethyl lactate and was then filtered through a filter having a pore diameter of 0.2 μm.

A layer, about 0.8 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 6 was found.

Example 7

A photoresist solution was prepared similarly to Comparative Example 3, except that 3 mol %, based on 2-methyl-4-hydroxy-5-isopropylphenyldimethylsulfonium triflate, of the compound

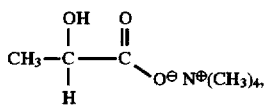

(=C2) were added.

After processing according to Comparative Example 3, a gamma value of 8 was found.

Example 8

A photoresist solution was prepared similarly to Comparative Example 3, but with 5 mol %, based on 2-methyl-4-hydroxy-5-isopropylphenyldimethylsulfonium triflate, of the compound C2. A gamma value of 8 was found.

Example 9

To test the shelf life, the resist solutions of Comparative Example 3 and Examples 7 and 8 were applied to 200 mm wafers in a layer thickness of about 800 nm.

The further processing and testing were carried out as described under Example 3.

|  |  | Waiting time | | |
|---|---|---|---|---|
|  |  | 10 min | 30 min | 60 min |
| Comparative Example 3 | without addition of C2 | 249 nm | 230 nm | 220 nm |
| Example 7 | with 3 mol % of C2 | 251 nm | 250 nm | 245 nm |
| Example 8 | with 5 mol % of C2 | 252 nm | 252 nm | 249 nm |

Example 10

In a further experiment, the exposure latitude was determined. The depth of focus was determined by processing the wafers with different exposure doses and varying depth of focus of the exposure unit. After development with an aqueous alkaline developer, the widths of the lines produced were determined using a scanning electron microscope.

Since the depth of focus is dependent on the mask dimensions, different line widths were measured.

The following results were obtained for the resist formulations from Comparative Example 3 and Examples 7 and 8:

|  | Depth of focus (μm) at a line width of | |
|---|---|---|
|  | 250 nm | 350 nm |
| Comparative Example 3 | 0.8 | 1.2 |
| Example 7 | 1.3 | 1.6 |
| Example 8 | 1.3 | 1.6 |

Comparative Example 4

A photoresist solution was prepared from 5 parts of 2-methyl-4-hydroxy-5-isopropylphenyldimethylsulfonium triflate, 95 parts of poly[4-hydroxystyrene-co-4-tetrahydropyranyloxystyrene-co-4-vinyl cyclohexanol] (molar ratio of the comonomers 55:38:7) and 320 parts of ethyl lactate and was then filtered through a filter having a pore diameter of 0.2 μm.

A layer, about 1.0 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 6.5 was found.

Example 11

A photoresist solution was prepared similarly to Comparative Example 4, except that 5 mol %, based on 2-methyl-4-hydroxy-5-isopropylphenyldimethylsulfonium triflate, of the compound

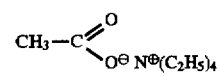

tetraethylammonium acetate (=C4) were added.

After processing according to Comparative Example 4, a gamma value of 9 was found.

Example 12

To test the depth of focus, the resist solutions from Comparative Example 4 and Example 11 were applied to 200 mm wafers in a layer thickness of about 100 nm.

The further processing was carried out as described under Example 10.

The following results were obtained for the resist formulations of Comparative Example 4 and Example 11:

|  | Depth of focus (μm) at a line width of | |
|---|---|---|
|  | 250 nm | 350 nm |
| Comparative Example 4 | 0.7 nm | 1.1 nm |
| Example 11 | 1.2 nm | 1.7 nm |

Comparative Example 5

A photoresist solution was prepared from 2.5 parts of 2-methyl-4-hydroxy-5-isopropylphenyldimethylsulfonium triflate, 2.5 parts of 3,5-dimethyl-4-hydroxyphenyldimethylsulfonium triflate, 95 parts of poly [4-hydroxystyrene-co-4-tetrahydropyranyloxystyrene-co-4-vinyl cyclohexanol] (molar ratio of the comonomers 48:40:12) and 320 parts of ethyl lactate and was then filtered through a filter having a pore diameter of 0.2 μm.

A layer, about 0.8 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 7.5 was found.

Example 13

A photoresist solution was prepared similarly to Comparative Example 5, except that 6 mol %, based on 2-methyl-4-hydroxy-5-isopropylphenyldimethylsulfonium triflate, of tetraethylammonium toluene-4-sulfonate (=C5) were added.

After processing according to Comparative Example 5, a gamma value of 8.5 was found.

Example 14

A photoresist solution was prepared similarly to Comparative Example 5, except that 10 mol %, based on 2-methyl-4-hydroxy-5-isopropylphenyldimethylsulfonium triflate, of tetraethylammonium toluene-4-sulfonate (=C5) were added.

After processing according to Comparative Example 5, a gamma value of 8.5 was likewise found.

Comparative Example 6

A photoresist solution was prepared from 3 parts of 4-methoxyphenyl phenyl disulfone, 95 parts of poly[4-hydroxystyrene-co-4-tetrahydropyranyloxystyrene-co-4-vinyl cyclohexanol] (molar ratio of the comonomers 49:38:13) and 320 parts of ethyl lactate and was then filtered through a filter having a pore diameter of 0.2 μm.

A layer, about 0.8 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 5.5 was found.

Example 15

A photoresist solution was prepared similarly to Comparative Example 6, except that 5 mol %, based on 4-methoxyphenyl phenyl disulfone, of the compound

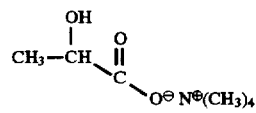

(=C6) were added.

After processing according to Comparative Example 6, a gamma value of 7.5 was found.

Example 16

To test the depth of focus, the resist solutions from Comparative Example 6 and Example 15 were applied to 200 mm wafers in a layer thickness of about 800 nm.

The further processing was carried out as described under Example 10.

The following results were obtained for the resist formulations of Comparative Example 6 and Example 15:

|  | Depth of focus (μm) at a line width of | |
|---|---|---|
|  | 250 nm | 350 nm |
| Comparative Example 6 | 0.6 | 1.0 |
| Example 15 | 1.0 | 1.3 |

Comparative Example 7

A photoresist solution was prepared from 6 parts of bis-4-methylphenylsulfonyldiazomethane, 95 parts of poly [4-hydroxystyrene-co-4-tetrahydropyranyloxystyrene-co-4-vinyl cyclohexanol] (molar ratio of the comonomers 49:38:13) and 320 parts of ethyl lactate and was then filtered through a filter having a pore diameter of 0.2 μm.

A layer, about 0.8 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 6.4 was found.

Example 17

A photoresist solution was prepared similarly to Comparative Example 7, except that 4 mol %, based on bis-4-methylphenylsulfonyldiazamethane, of the compound

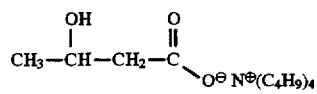

(=C7) were added.

After processing according to Comparative Example 7, a gamma value of 7.5 was found.

Comparative Example 8

A photoresist solution was prepared from 10 parts of 2,6-dinitrobenzyl 4-toluenesulfonate, 90 parts of poly[4-hydroxystyrene-co-4-tetrahydropyranyloxystyrene-co-4-vinyl cyclohexanol] (molar ratio of the comonomers 55:38:7) and 320 parts of ethyl lactate and was then filtered through a filter having a pore diameter of 0.2 μm.

A layer, about 1.0 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 5.0 was found.

Example 18

A photoresist solution was prepared similarly to Comparative Example 8, except that 5 mol %, based on 2,6-dinitrobenzyl 4-toluenesulfonate, of the compound

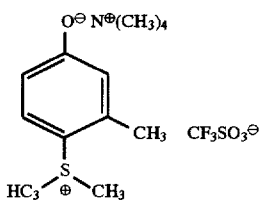

(=C8) were added.

After processing according to Comparative Example 8, a gamma value of 6.5 was found.

Example 19

To test the depth of focus, the resist solutions from Comparative Example 8 and Example 18 were applied to 200 mm wafers in a layer thickness of about 800 nm.

The further processing was carried out as described under Example 10.

The following results were obtained for the resist formulations of Comparative Example 8 and Example 18:

|  | Depth of focus (μm) at a line width of | |
| --- | --- | --- |
|  | 250 nm | 350 nm |
| Comparative Example 8 | 0.8 | 1.2 |
| Example 18 | 1.1 | 1.6 |

Comparative Example 9

A photoresist solution was prepared from 5 parts of 3-methyl-4-hydroxyphenyldimethylsulfonium triflate, 95 parts of poly[4-hydroxystyrene-co-4-tetrahydropyranyloxystyrene-co-4-vinyl cyclohexanol] (molar ratio of the comonomers 54:40:6) and 320 parts of ethyl lactate and was then filtered through a filter having a pore diameter of 0.2 μm.

A layer, about 0.8 μm thick, of this solution was applied to a surface-oxidized silicon wafer by spin coating and was heated for 1 minute at 130° C. After exposure to Excimer laser light of 248 nm wavelength through a structured test mask, this wafer was postbaked at 130° C. for 1 minute and developed with an aqueous alkaline developer for 1 minute.

After measurement of the photoresist layers remaining on the test wafer, the contrast of the resist was determined. A gamma value of 6.5 was found.

Example 20

A photoresist solution was prepared similarly to Comparative Example 9, except that 2 mol %, based on 3-methyl-4-hydroxyphenyldimethylsulfonium triflate, of the compound

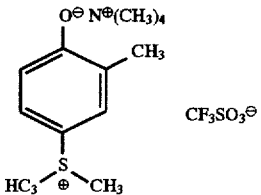

(=C9) were added.

After processing according to Comparative Example 9, a gamma value of 7.5 was found.

Example 21

A photoresist solution similar to Comparative Example 9 but containing 4 mol %, based on 3-methyl-4-hydroxyphenyldimethylsulfonium triflate, of the compound C9 gave a gamma value of 9.

Example 22

A photoresist solution similar to Comparative Example 9 but containing 6 mol %, based on 3-methyl-4-hydroxyphenyldimethylsulfonium triflate, of the compound C9 gave a gamma value of 9.

Example 23

To test the shelf life, photoresist solutions from Comparative Example 9 and Examples 20, 21 and 22 were applied to wafers having a diameter of 200 mm in a layer thickness of about 800 nm.

The further processing was carried out as described under Example 3.

The measured line widths after different waiting times are shown in the table below:

|  |  | Waiting time | | | |
| --- | --- | --- | --- | --- | --- |
|  |  | none | 20 min | 40 min | 60 min |
| Comparative Example 9 | without addition | 252 nm | 242 nm | 230 nm | 218 nm |
| Example 20 | with 2 mol % of C9 | 253 nm | 251 nm | 230 nm | 225 nm |
| Example 21 | with 4 mol % of C9 | 256 nm | 252 nm | 249 nm | 242 nm |
| Example 22 | with 6 mol % of C9 | 255 nm | 250 nm | 247 nm | 239 nm |

Example 24

In a further experiment, the exposure latitude was determined. The depth of focus was determined by processing the wafers with different exposure doses and variable depth of focus of the exposure unit.

The following results were obtained for the resist formulations from Comparative Example 9 and Examples 20, 21 and 22 for 250 nm and 350 nm wide lines produced by lithography:

|  | Depth of focus (μm) at a line width of | |
| --- | --- | --- |
|  | 250 nm | 350 nm |
| Comparative Example 9 | 0.7 | 1.2 |
| Example 20 | 1.2 | 1.6 |
| Example 21 | 1.4 | 1.8 |
| Example 22 | 1.4 | 1.8 |

Comparative Example 10

A photoresist solution was prepared from 10 parts of 1,2,3-tris(methanesulfonyloxy)benzene, 90 parts of poly[4-hydroxystyrene-co-4-tetrahydropyranyloxystyrene-co-4-vinyl cyclohexanol] (molar ratio of the comonomers 47:40:13) and 320 parts of ethyl lactate and was then filtered through a filter having a pore diameter of 0.2 am.

A layer, about 0.8 μm thick, of this solution was applied to a surface-oxidized silicon wafer by spin coating and was heated for 1 minute at 125° C. After exposure to Excimer laser light of 248 nm wavelength through a structured test mask, this wafer was postbaked at 125° C. for 1 minute and developed with an aqueous alkaline developer for 1 minute.

After measurement of the photoresist layers remaining on the test wafer, the contrast of the resist was determined. A gamma value of 5.4 was found.

Example 25

A photoresist solution was prepared similarly to Comparative Example 10, except that 5 mol %, based on 1,2,3-tris(methanesulfonyloxy)benzene, of the compound $$(CH_3)_4N^\oplus \ ^\ominus O-\langle\text{phenyl}\rangle-C(CH_3)_2-\langle\text{phenyl}\rangle-O^\ominus \ N^\oplus(CH_3)_4$$

(=C10) were added.

After processing according to Comparative Example 10, a gamma value of 6.5 was found.

Example 26

To test the shelf life, the resist solutions from Comparative Example 10 and Example 25 were applied to 200 mm wafers in a layer thickness of about 800 nm.

The further processing was carried out as described under Example 3.

The measured line widths of 250 nm wide structures after different waiting times are shown in the table below:

|  |  | Waiting time | | | |
| --- | --- | --- | --- | --- | --- |
|  |  | none | 20 min | 40 min | 60 min |
| Comparative Example 10 | without addition | 253 nm | 240 nm | 231 nm | 219 nm |
| Example 25 | with 5 mol % of C10 | 251 nm | 250 nm | 237 nm | 230 nm. |

We claim:

1. A positive-working radiation-sensitive mixture essentially consisting of ($a_1$) at least one water-insoluble, organic polymeric binder which contains acid-labile groups and becomes soluble in aqueous alkaline solutions as a result of the action of acid, or ($a_{2.1}$) a polymeric binder which is insoluble in water and soluble in aqueous alkaline solutions and ($a_{2.2}$) a low molecular weight organic compound whose solubility in an aqueous alkaline developer is increased as a result of the action of acid, and (b) at least one organic compound which produces an acid under the action of actinic radiation, and, if required, (c) one or more further organic compounds which differ from (b), wherein at least one of the components ($a_1$), ($a_{2.1}$), (a2.2), (b) and (c) contains a bonded group of the formula (I) $-O^\ominus \ N^\oplus R_4$, or component (c) is of the formula (II)

$$^\ominus O-\underset{\underset{O}{\|}}{C}+CH_2\}_n CH_2-N^\oplus R_3 \quad (II)$$

where R is alkyl of 1 to 6 carbon atoms and n is from 1 to 6.

2. The radiation-sensitive mixture of claim 1, wherein at least one of the components ($a_1$), ($a_{2.1}$), ($a_{2.2}$), (b) and (c) contains a group of the formula $$\langle\text{phenyl with R''''}\rangle-O^\ominus \ N^\oplus R_4$$

where R''''=H, Halogen, Alkoxy or $C_1$–$C_4$-Alkyl $$-\underset{\underset{O}{\|}}{C}-O^\ominus \ N^\oplus R_4 \quad \text{or} \quad -\underset{\underset{O}{\|}}{\overset{\overset{O}{\|}}{S}}-O^\ominus \ N^\oplus R_4.$$

3. The radiation-sensitive mixture of claim 1, wherein at least one of the components ($a_1$) or ($a_{2.1}$) respectively contains units of the formula (III), (IV) or (V)

$$-CH_2-CR'- \quad \text{(III)}$$
$$\langle\text{phenyl with R''}\rangle$$
$$O^\ominus \ N^\oplus R_4$$

$$-CH_2-CR'- \quad \text{(IV)}$$
$$\langle\text{phenyl with R''}\rangle$$
$$O-CH_2-\underset{\underset{O^\ominus \ N^\oplus R_4}{}}{\overset{\overset{O}{\|}}{C}}$$

$$-CH_2-CR'- \quad \text{(V)}$$
$$|$$
$$C=O$$
$$|$$
$$O^\ominus \ N^\oplus R_4$$

where R' is H or $CH_3$
and R'' is H or alkyl of 1 to 4 carbon atoms.

4. The radiation-sensitive mixture of claim 1, which contains, as component (c), an organic compound selected from the group consisting of $$\underset{R^2}{\overset{R^3}{}}\langle\text{phenyl with }R^4, R^5, S^\oplus, R^1\rangle O^\ominus \ N^\oplus R_4 \quad X^\ominus$$

where $X^\ominus$ is $CF_3SO_3^\ominus$, $SbF_6^\ominus$, $AsF_6^\ominus$ or $PF_6^\ominus$, $R^1$, $R^2$ and $R^3$ are identical or different and are each H, $CH_3$, $C_2H_5$, n-$C_3H_7$, $OCH_3$, phenyl halogen or straight-chain or branched $C_4H_9$ and $R^4$ and $R^5$ may be identical or different and are each alkyl of 1 to 6 carbon atoms, phenyl or alkyl-, halogen- or hydroxyl-substituted phenyl, or $R^4$ is linked to $R^5$ via $CH_2$ groups to form a five- or six-membered ring.

5. A radiation-sensitive mixture as claimed in claim 1, which contains, as component (c), an organic compound selected from the group consisting of

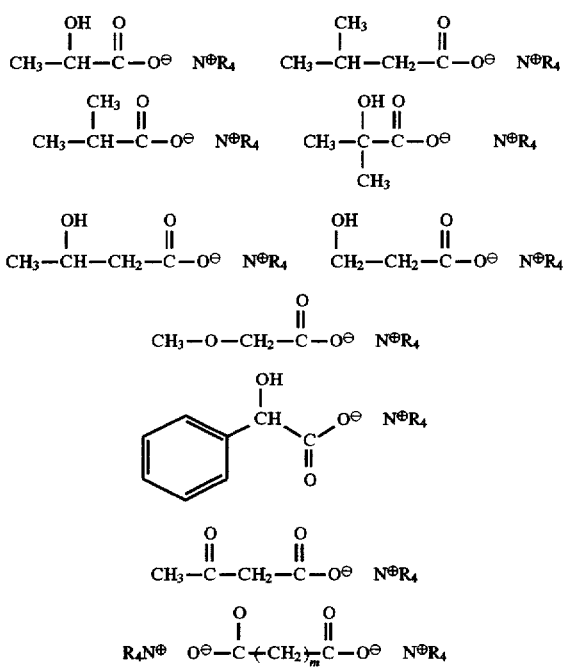

where m is 1 to 4

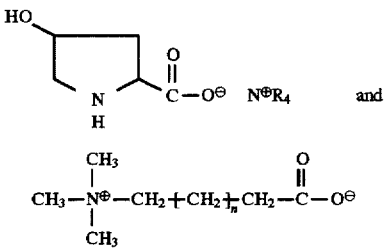

where n is 1 to 3.

6. A radiation-sensitive mixture as claimed in claim 1, which contains, as component (b), a sulfonium salt, iodonium salt, benzoin tosylate, pyrogallol trimesylate, o-nitrobenzyl tosylate, diaryl disulfone, bisarylsulfonyldiazomethane, biscyclohexylsulfonyldiazomethane or an iminosulfonate having the structural unit

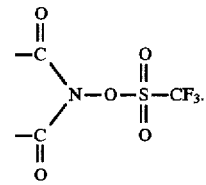

7. A radiation-sensitive mixture as claimed in claim 1, wherein the component ($a_1$) contains units of the formulae (VI), (VII) and, if required, (VIII)

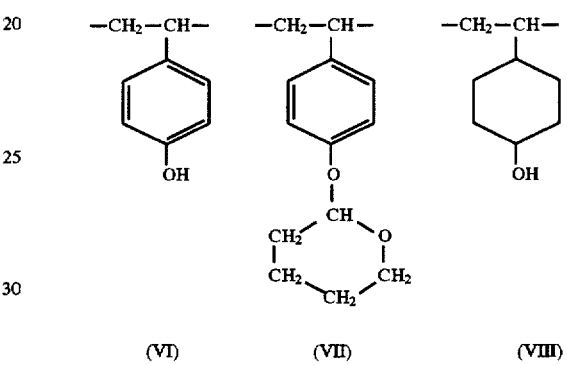

8. A radiation-sensitive mixture as claimed in claim 1, wherein, in the formulae (I) or (II), R is $CH_3$.

9. A radiation-sensitive mixture as claimed in claim 1, which is in the form of a solution in an organic solvent or solvent mixture.

* * * * *

UNITED STATES PATENT AND TRADEMARK OFFICE
CERTIFICATE OF CORRECTION

PATENT NO.: 5,783,354

DATED: July 21, 1998

INVENTOR(S): SCHWALM et al.

It is certified that error appears in the above-identified patent and that said Letters Patent is hereby corrected as shown below:

Column 24, claim 5, line 1, "A radiation-sensitive mixture as claimed in claim 1" should read --The radiation-sensitive mixture of claim 1--.

Column 26, claim 6, line 1, "A radiation-sensitive mixture as claimed in claim 1" should read --The radiation-sensitive mixture of claim 1--.

Column 26, claim 7, line 1, "A radiation-sensitive mixture as claimed in claim 1" should read --The radiation-sensitive mixture of claim 1--.

Column 26, claim 8, line 1, "A radiation-sensitive mixture as claimed in claim 1" should read --The radiation-sensitive mixture of claim 1--.

Column 26, claim 9, line 1, "A radiation-sensitive mixture as claimed in claim 1" should read --The radiation-sensitive mixture of claim 1--.

Signed and Sealed this

Third Day of November, 1998

*Attest:*

BRUCE LEHMAN

*Attesting Officer*   *Commissioner of Patents and Trademarks*